United States Patent
Arafa et al.

(10) Patent No.: US 6,228,777 B1
(45) Date of Patent: May 8, 2001

(54) INTEGRATED CIRCUIT WITH BORDERLESS CONTACTS

(75) Inventors: Mohamed Arafa, Hillsboro; Scott Thompson, Portland, both of OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/328,190

(22) Filed: Jun. 8, 1999

(51) Int. Cl.$^7$ .................................................. H01L 21/302
(52) U.S. Cl. ............................................ 438/740; 438/740
(58) Field of Search ..................................... 438/664, 666, 438/683, 674, 704, 740, 970, 634, 675, 655, 221, 437, 291, 910

(56) References Cited

U.S. PATENT DOCUMENTS

| | | | |
|---|---|---|---|
| 4,208,780 | 6/1980 | Richman | 29/571 |
| 4,441,247 | 4/1984 | Gargini et al. | 29/571 |
| 4,557,036 | 12/1985 | Kyuragi et al. | 29/571 |
| 4,650,696 | 3/1987 | Raby . | |
| 4,732,801 | 3/1988 | Joshi | 428/198 |
| 4,749,631 | 6/1988 | Haluska et al. | 428/704 |
| 4,755,480 | 7/1988 | Yau et al. . | |
| 4,866,003 | 9/1989 | Yokoi et al. . | |
| 4,920,073 | 4/1990 | Wei et al. . | |
| 4,948,482 | 8/1990 | Kobayashi et al. | 204/192 |
| 4,966,870 | 10/1990 | Barber et al. . | |
| 4,997,518 | 3/1991 | Madokoro | 156/643 |
| 5,089,432 | 2/1992 | Yoo . | |
| 5,180,688 | 1/1993 | Bryant et al. . | |
| 5,268,330 | * 12/1993 | Givens et al. | 438/675 |
| 5,275,972 | 1/1994 | Ogawa et al. . | |
| 5,285,103 | 2/1994 | Chen et al. | 257/644 |
| 5,314,847 | 5/1994 | Watanabe et al. . | |
| 5,372,969 | 12/1994 | Moslehi . | |
| 5,409,858 | 4/1995 | Thakur et al. . | |
| 5,474,955 | 12/1995 | Thakur . | |
| 5,633,202 | 5/1997 | Brigham et al. | 438/763 |
| 5,652,176 | * 7/1997 | Maniar et al. | 438/970 |
| 6,090,671 | * 7/2000 | Balasubramanyam | 438/291 |
| 6,096,642 | * 8/2000 | Wu | 438/655 |

FOREIGN PATENT DOCUMENTS

| | | |
|---|---|---|
| 2116132 | 4/1990 | (JP) . |
| 4129223 | 4/1992 | (JP) . |
| 5029252 | 2/1993 | (JP) . |

OTHER PUBLICATIONS

R.C. Sun, J.T. Clemens, J.T. Nelson, "Effects of Silicon Nitride Encapsulation on MOS Device Stability". JEEE 18th Annual Proceedings Reliability Physics 1980, pp. 244–251.

A. Hamada, E. Takeda, "AC Hot–Carrier Effect Under Mechanical Stress", IEEE Symposium on VLSI Technology Digest of Technical Papers, Jun. 1992, pp. 98–99.

M. Shimbo, T. Matsuo, "Thermal Stress in CVD PSG and $SiO_2$ Films on Silicon Substrates", Journal of the electrochemical Society, vol. 130 No. 1, Jan. 1983, pp. 135–138.

K. Okuyama, K. Kubota, T. Hashimoto, S. Ikeda, A. Koike, "Water–Related Threshold Voltage Instability of Polysilicon TFTs", IEDM International Electron Devices Meeting, Dec. 1993, p 527–530.

N. Lifshitz, G. Smolinsky, "Water–Related Charge Motion in Dielectrics", Journal of the Electrochemical Society, vol. 136, No. 8, Aug. 1989, pp. 2335–2340.

(List continued on next page.)

*Primary Examiner*—David Nelms
*Assistant Examiner*—David Nhu
(74) *Attorney, Agent, or Firm*—Mark Seeley

(57) ABSTRACT

An integrated circuit comprising a conductive region formed on a semiconductor substrate, a silicate glass layer formed on the conductive region, and an etch stop layer formed on the silicate glass layer. The integrated circuit also includes a borderless contact that is coupled to the conductive region.

10 Claims, 3 Drawing Sheets

OTHER PUBLICATIONS

M. Noyori, et al, "Comparisons of Instabilities in Scaled CMOS Devices Between Plastic and Hermetically Encapsulated Devices", IEEE Transactions on Electron Devices, Oct. 1983 pps.

W. H. Stinebaugh, Jr., et al, "Correlation of Gm Degradation of Submicrometer MOSFET's with Refractive Index and Mechanical Stress of Encapsulation Materials".

IEEE Transactions on Electron Devices, Vo. 36, No. 3, Mar. 1989, pp. 542–547.

C.E. Blat, E.H. Nicollian, E.H. Poindexter, "Mechanism of Negative–Bias–Temperature Instability", Journal of Applied Physics, vol. 69, No.3, 2/91, pp. 1712–1720.

J. Takahashi, K. Machida, N. Shimoyama, K. Minegishi, "Water Trapping effect of Point Defects in Interlayer Plasma CVD SiO2 Films", Proceedings Ninth International VLSI Multilevel Interconnection Conference (VMIC), Jun. 1992, pp. 331–336.

N. Stojadinovic, S. Dimitrijev, "Instabilities in MOS Transistors", Microelectroncs and Relibility, 1989, vol. 29, No. 3 pp. 371–380.

K. Shmokawa, T. Usami, S. Tokitou, N. Hirashita, M. Yoshimaru, M. Ino, "Supression of the MoS Transistor Hot Carrier Degradation Casued by Watdr Desorbed from Intermetal Dielectric", IEEE Symposium on VLSI Technology Digest of Technical Papers, Jun. 1992, pp. 96–97.

A.N. Saxena, K Ramkumar, S.K. Ghosh, "Stresses in TEOS Based SiO2 Films and Reliability of Multilevel Metalizations", Proceedings Ninth International VLSI Multilevel Interconnection Conference (VMIC, Jun. 1992, pp. 427–429.

V. Jain, D. Praminik, "Impact of Inter Metal Oxide Structures and Nitride Passivation on Hot Carrier Reliability of Sub–Micron MOS Devices", proceedings Ninth International VLSI Multilevel Interconnection Conference (VMIC), Jun. 1992, pp. 417–419.

N. Shimoyama, K. Machida, K. Murase, T. Tsuchiya, "Enhanced Hot–Carrier Degradation Due to Water in TEOS/O3–Oxide and Water Blocking Effect of ECR–SiO2", IEEE Symposium on VLSI Technology, Jun. 1992, pp. 94–95.

A. Hamada, T. Furusawa, E. Takeda, "A New Aspect on Mechanical Strress Effects in Scaled MOS Devices", IEEE Symposium on VLSI Technology Digest of Technical Papers, 6/90 p.

M. Noyori, T. Ishihara, H. Higuchi "Secondary Slow Trapping–A New Moisture Induced Instability Phenomenon in Scaled CMOS Devices", IEEE 20th Annual Proceedings Reliability 1982, p.

J. Mitsuhashi, H. Muto, Y. Ohno, T. Matsukawa, "Effect of P–SiN Passivation Layer on Time–Dependent Dielectric Breakdown in SiO2", IEEE 25th Annual Proceedings Reliability Physics, Apr. 1987, pp. 60–65.

K.P. MacWilliams, L.E. Lowry, D.J. Swanson, J. Scarpulla, "Wafer–Mapping of Hot Carrier Lifetime Due to Physical Stress Effects", IEEE Symposium on VLSI Technology, Digest of Technical Papers, Jun. 1992, pp. 100–101.

J. Mitusuhashi, S. Kakao, T. Matsukawa, Mechanical Stress and Hydrogen Effects on Hot Carrier Injection, IEE–IEDM Tech Digest, International Electron Devices Meeting 12/86, p.

Y. Ohno, A. Ohsaki, T. Kaneoka, J. Mitsuhashi, M. Hirayama, T. Kato, "Effect of Mechanial Stress for Thin SiO2 Films in TDDB and CCST Characteristics", IEE 27th Annual Proceedings Reliability Physics, Apr. 1989, pp. 34–38.

W. Abadeer, W. Tonti, et al, Bias Temperature Reliability of N+ and P+ Polysilicon Gates NMOSFETs and POMSFETs, IEEE 31st Annual Proceedings Reliability, 8/93, pp. 147–149.

K.O. Jeppson, C.M. Svensson "Negative bias stress of MOS devices at high electric fields and degradation of MNOS devices" Journal of Applied Physics V48, #5, 5/77 pp. 2004–2014.

R.T. Fuller, W.R. Richards, Y. Nissan–Cohen, J.C. Tsang, P.M. Sandow, "The Effects of Nitride Layers On Surface State Density and the Hot Electron Lifetime of Advanced CMOS Circuits" IEEE 1987, Custom Intefrated Circuits Conference, pp. 337–340.

S. Fujita, Y. Uemoto, A. Sasaki, "Trap Generation in Gate Oxide Layer of MOS Structures Encapsulated by Silicon Nitride", IEDM–IEEE 1985, pp. 64–67.

Stanley Wolf, "Silicon Processor the VLSI Era", vol. 1, pp. 191–195/514–515.

Stanley Wolf, "Silicon Processing for the VLSI Era", vol. 2, pp. 132–133, 144–145, 164–165, 188–189, 194–195, 392–396.

M. Noyori, et al., "Characteristics & Analysis of Instability Induced by Secondary Slow Trapping in Scaled CMOS Devices", IEEE Transactions Reliability, 8/83 pp. 323–329.

* cited by examiner

INTEGRATED CIRCUIT WITH BORDERLESS CONTACTS

FIELD OF THE INVENTION

The present invention relates to integrated circuits and a method for making them.

BACKGROUND OF THE INVENTION

To continue adding transistors to integrated circuits without significantly increasing die sizes, the distance between transistors and other devices may have to be reduced. The need to reduce the distance between devices may require reducing the width of the landing area for the contacts. As a result, when contact is made to the landing area, part of the contact may extend laterally over the isolation structure, forming a borderless contact. To prevent the contact etch step from etching into the isolation structure, an etch stop layer may be formed on the surface of the device prior to performing the contact etch. Such a layer may comprise silicon nitride.

In conventional devices, which do not include borderless contacts, an interlayer dielectric ("ILD") that includes a silicon dioxide, PSG, or BPSG layer is frequently formed on a silicide. The presence of that layer, and the processes used to deposit and etch it, give the resulting device certain properties. When a silicon nitride layer is formed between the silicide and such an ILD layer, for enabling borderless contacts, the silicon nitride layer (and processes used to form and etch it) may cause the resulting device's characteristics to differ from those of a device that lacks such a layer.

Some of those changes may be undesirable. For example, adding such a silicon nitride layer may introduce certain stresses that can degrade the saturation current or cause the device's threshold voltage to shift. Depositing a silicon nitride layer directly on top of a silicide may increase the silicide's sheet resistance and adversely affect the way the silicide agglomerates. When using a plasma process to remove silicon nitride, different charging characteristics may result, when compared to those that result when etching the ILD layer. Also, when such a silicon nitride etch stop layer is deposited using a hot wall chemical vapor deposition ("CVD") process, significant portions of the silicide may oxidize.

Accordingly, there is a need for a method for making a device having borderless contacts that mitigates against the type of device characteristic changes and performance degradation that the silicon nitride etch stop layer may cause. In particular, there is a need for a device that is not adversely affected by stresses, unwanted changes to silicide properties, or undesirable charging effects, which may result from forming such a layer. There is also a need for a process for making a device that includes such a silicon nitride layer that permits use of a hot wall CVD process to deposit such a layer, without causing significant oxidation of the silicide.

SUMMARY OF THE INVENTION

The present invention covers an integrated circuit comprising a conductive region formed on a semiconductor substrate, a silicate glass layer formed on the conductive region, and an etch stop layer formed on the silicate glass layer. The integrated circuit also includes a borderless contact that is coupled to the conductive region. The present invention further covers a method for forming such an integrated circuit.

DETAILED DESCRIPTION OF THE PRESENT INVENTION

Figure 1:
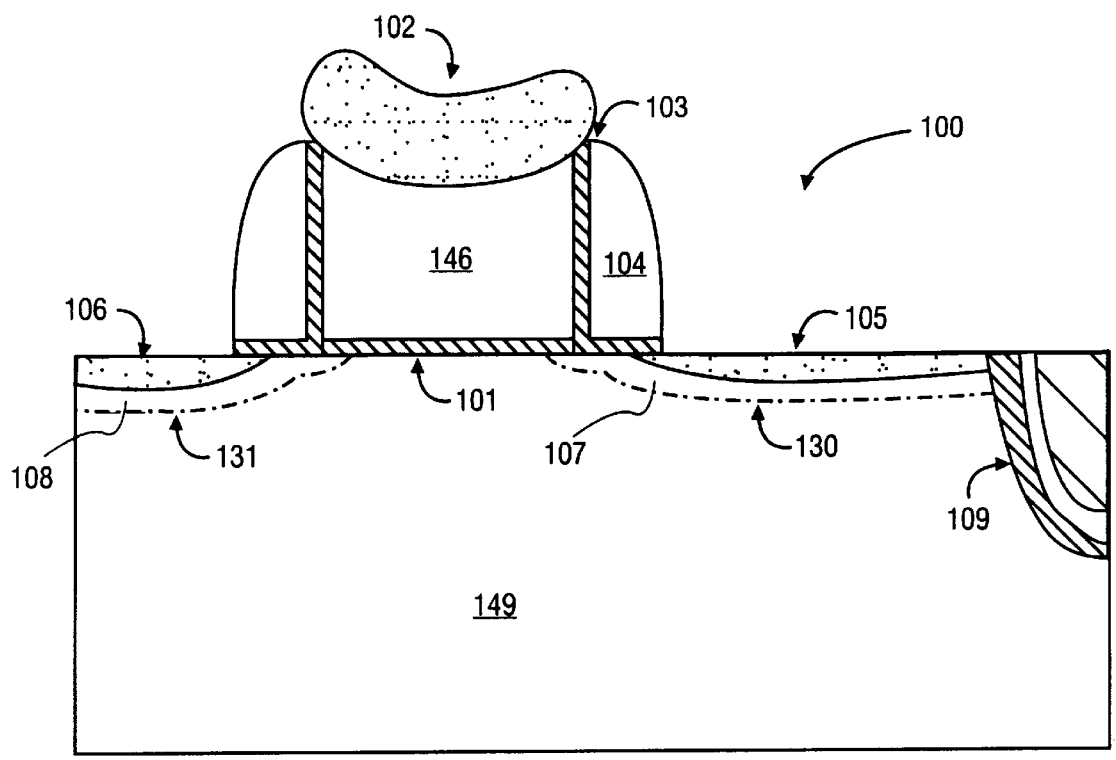
FIG. 1. is an illustration of a cross-section of a device that may be formed when making an embodiment of the integrated circuit of the present invention.

An improved integrated circuit and method for making it are described. FIG. 1 illustrates a device 100 that may be made using conventional process steps for forming an integrated circuit. Device 100 represents a structure that may be used to form an MOS transistor, and includes well 149 upon which is formed gate oxide 101 and gate 102. As shown, gate 102 comprises polysilicon 146 and silicide 148. On the sides of gate 102 is oxide 103, which serves as a stress buffer for the nitride layer used to form nitride spacers 104. On either side of spacers 104 are conductive regions 130 and 131, which are formed on well 149. In this embodiment of the present invention, conductive regions 130 and 131 comprise suicides 105 and 106, which rest on diffused regions 107 and 108, respectively. Also shown in FIG. 1 is shallow trench isolation structure 109 formed adjacent to well 149.

Well 149 may be a heavily doped (e.g., p+ or n+) p-well or n-well, depending upon whether the device formed above well 149 is an n-MOS or p-MOS device. Gate oxide 101, gate 102, oxide 103, nitride spacers 104, suicides 105 and 106 and diffused regions 107 and 108 may be made from materials conventionally used to form such structures using conventional process steps, as is well understood by those skilled in the art.

Although conductive regions 130 and 131 shown in FIG. 1 include suicides 105 and 106 formed on diffused regions 107 and 108, any conductive structure or material that may receive a borderless contact may comprise a conductive region, as that term is used herein. The term "conductive region" is thus not intended to be limited to the structure shown in FIG. 1.

Shallow trench isolation structure 109 may comprise a combination of grown and deposited oxide and may be formed in numerous ways, such as using the process described in U.S. Pat. No. 5,719,085, assigned to this application's assignee.

Figure 2:
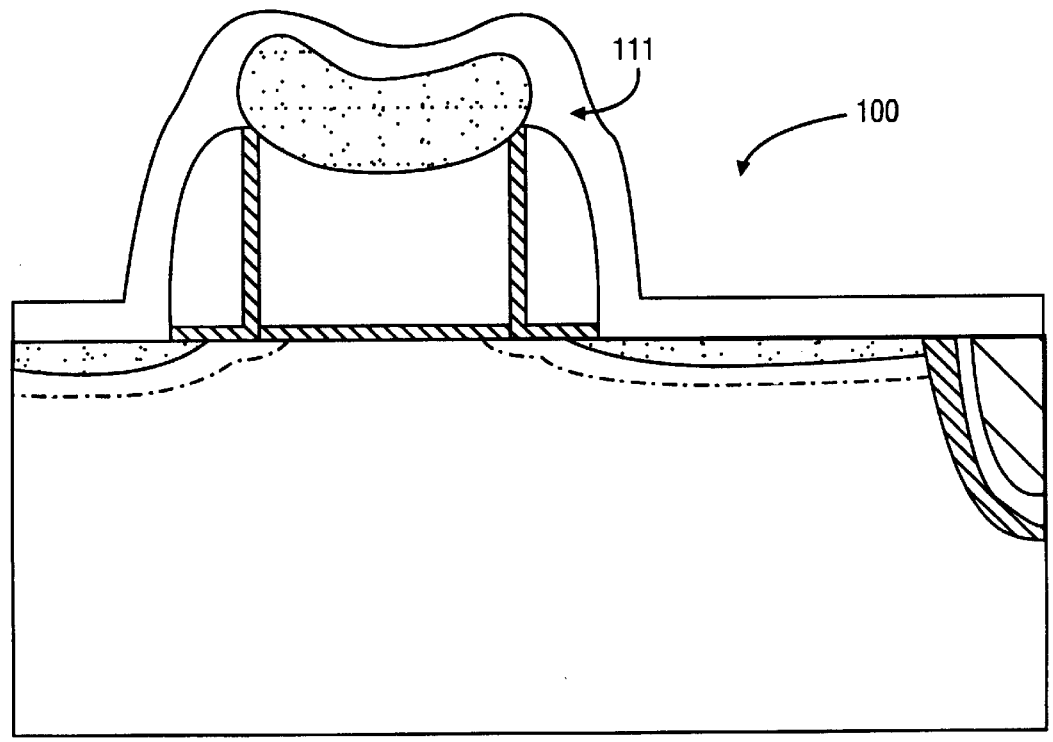
FIG. 2 is an illustration of a cross-section of the device shown in FIG. 1 that includes a silicate glass layer formed on a silicide.

When making one embodiment of the integrated circuit of the present invention, relatively thin silicate glass layer 111 is formed on the surface of device 100, as shown in FIG. 2. Preferably, layer 111 is between about 100 and about 1,000 angstroms thick, and more preferably between about 200 and about 400 angstroms thick.

Silicate glass layer 111 may comprise an undoped silicon dioxide, phosphosilicate glass (PSG) or borophosphosilicate glass (BSPG) layer. Such a layer may be formed on the surface of device 100 by applying a conventional plasma enhanced CVD (PECVD), atmospheric pressure CVD (APCVD) or low pressure CVD (LPCVD) process. Preferably, layer 111 comprises silicon dioxide deposited onto the surface of device 100 using a PECVD process, which employs conventional equipment and materials, e.g., silane, tetraethylorthosilicate (TEOS), or some other silicon source.

Figure 3:
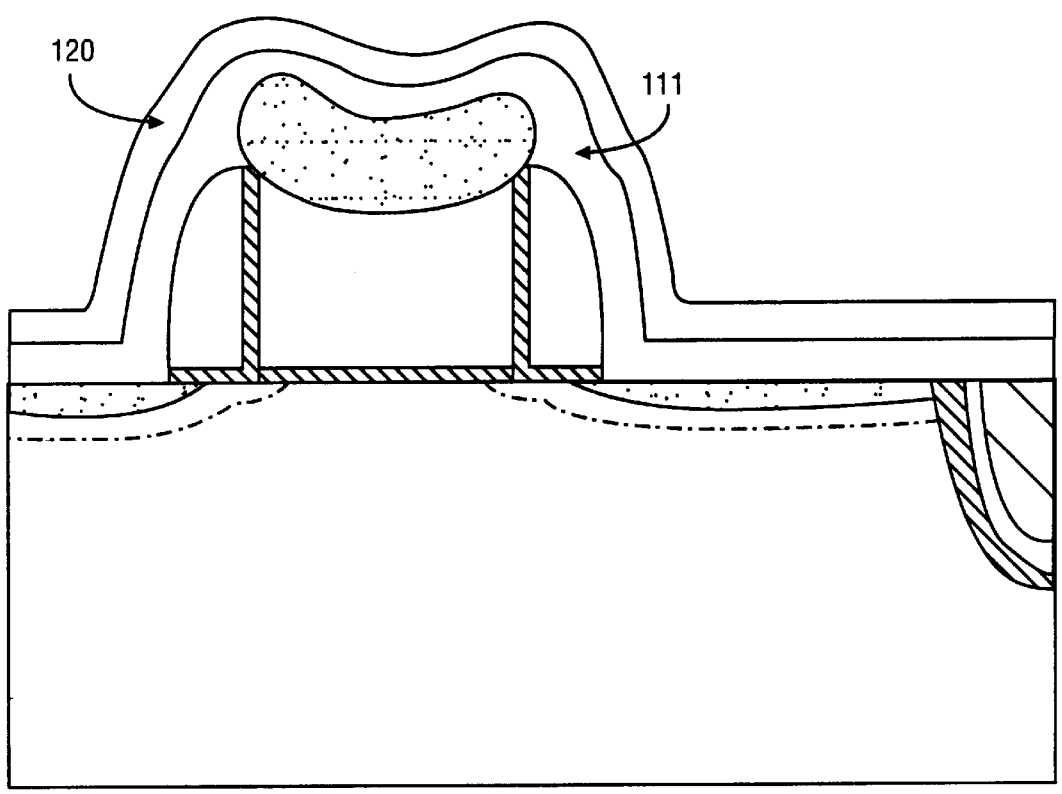
FIG. 3 is an illustration of a cross-section of the device shown in FIG. 2 that includes an etch stop layer formed on the silicate glass layer.

After forming silicate glass layer 111, etch stop layer 120 is formed on silicate glass layer 111, as shown in FIG. 3.

Layer 120 preferably comprises silicon nitride, which may be deposited onto silicate glass layer 111 using conventional techniques for forming a silicon nitride layer, some of which are described in U.S. Pat. No. 5,633,202, assigned to this application's assignee. In this embodiment of the present invention, layer 120 preferably is between about 100 and about 1,500 angstroms thick, and more preferably between about 200 and about 500 angstroms thick.

When made from silicon nitride, layer 120 may be formed using a hot wall LPCVD or a PECVD process. When the hot wall process is used, dichlorosilane and ammonia may be fed into the reactor at a temperature that is preferably between about 550 and about 800° C. Such a hot wall process is preferred to a PECVD process for depositing silicon nitride as the resulting layer should provide more favorable selectivity, uniformity and quality. Unlike a PECVD process, a LPCVD process should not produce undesirable charging effects. In addition, because such an LPCVD process is a batch process, such a process may provide higher throughput than a PECVD process.

After etch stop layer 120 is deposited, ILD layer 125 is formed. ILD layer 125 may be formed from the same insulating material used to form silicate glass layer 111 using the same equipment and similar process steps, but modified to produce a layer that is between about 3,000 and about 10,000 angstroms thick. Alternatively, ILD layer 125 and layer 111 may be formed from different materials. Preferably, ILD layer 125 is a PSG layer formed using a PECVD process that employs TEOS—although other CVD processes, which use other silicon sources, may be used. Although ILD layer 125 preferably is a PSG layer, ILD layer 125 could instead comprise a silicon dioxide or BPSG layer or be formed from other materials that may provide an insulating function. When a PSG layer, the phosphorus source may be phosphine, diphosphide or trimethylphosphide. When a BPSG layer, the boron source may be diborane or trimethylborate.

Following deposition of ILD layer 125, that layer may be planarized, such as by applying a chemical mechanical polishing step. A layer of oxide (not shown) may then be deposited on top of ILD layer 125, e.g., by using TEOS in a PECVD process.

After the dielectric layer or layers have been formed on etch stop layer 120, a three step etch may be performed to etch the via for the contact through ILD layer 125, etch layer 120, and silicate glass layer 111. A single wafer, low frequency, parallel plate etcher may be used. The etch chemistry preferably employs Freon gases, e.g., $CHF_3$, $CF_4$, $C_2F_6$, as the active species. The etch chemistry may also include conventionally used amounts of argon and oxygen and/or nitrogen. By using an etch chemistry that has high etch selectivity for the material used to make ILD layer 125, when compared to the selectivity of silicon nitride layer 120, layer 120 may act as an etch stop preventing that etch step from reaching shallow trench isolation region 109.

After ILD layer 125 is etched, silicon nitride layer 120 is etched. Silicon nitride layer 120 may be etched using the same equipment used to etch ILD layer 125, but employing an etch chemistry having a high selectivity to silicon nitride, when compared to the selectivity of the material used to make layer 111. After layer 120 is etched, silicate glass layer 111 is etched. Silicate glass layer 111 may be etched using the same equipment and etch chemistry used to etch ILD layer 125, while modifying the process to account for the differences in thickness between those two layers. Although a three step etch process is preferred for making the via for the contact, a two step process may be used instead, where the first step etches through ILD layer 125 and the second step etches through both silicon nitride layer 120 and silicate glass layer 111.

Figure 4:
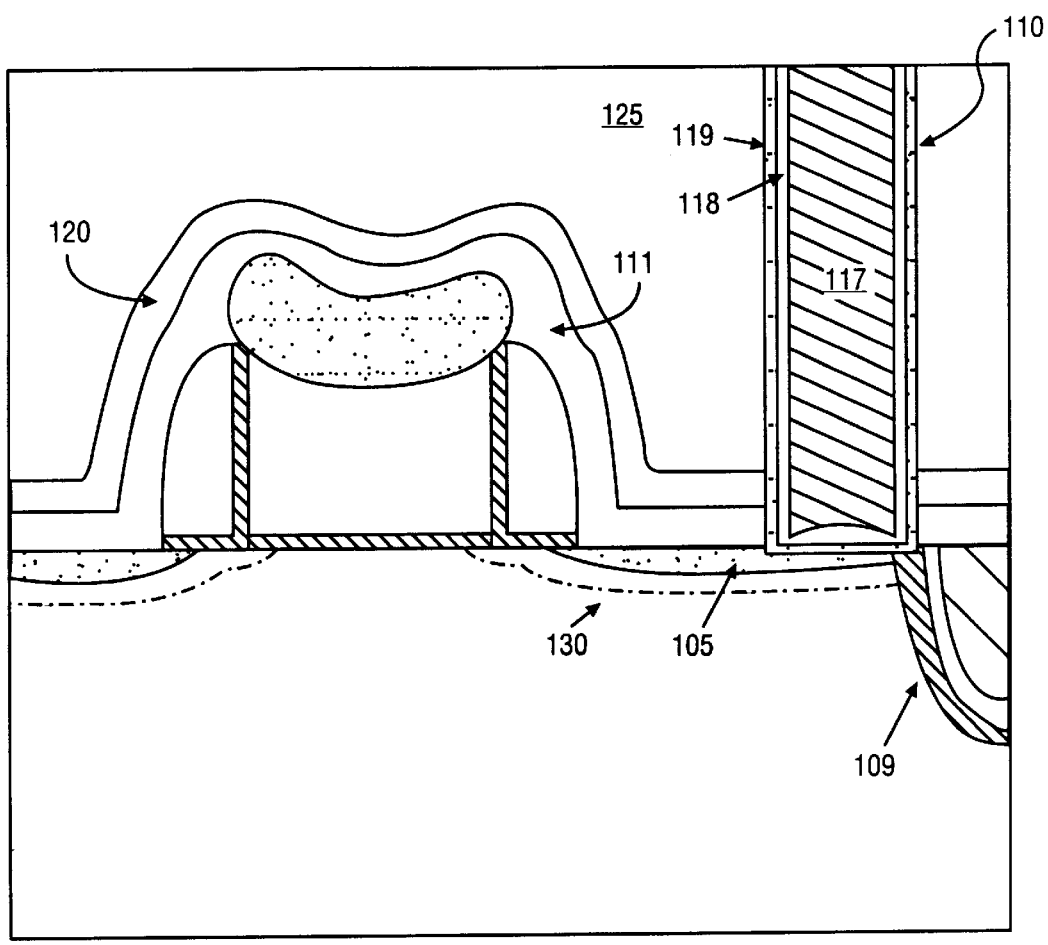
FIG. 4 is an illustration of a cross-section representing an embodiment of the integrated circuit of the present invention.

After the via has been etched through layers 125, 120 and 111, borderless contact 110 is formed to make electrical contact to conductive region 130, e.g., by contacting silicide 105, as shown in FIG. 4. Borderless contact 110 is formed by filling the via with a conductive material. As shown in FIG. 4, that conductive material may comprise relatively thin titanium and titanium nitride layers 119 and 118 and tungsten plug 117, which are successively deposited to fill the via.

Forming silicate glass layer 111 between silicide 105 and silicon nitride layer 120 may provide a number of advantages over processes that deposit a silicon nitride layer directly on the silicide. Silicate glass layer 111 acts as a stress reliever, which should reduce the shift in device characteristics that the silicon nitride layer may otherwise cause. Devices that include such a layer may also show reduced variance in resistance in both the silicide and the contacts, and may be more reliable. In addition, the presence of such a silicate glass layer may decrease the amount of silicide degradation and adverse charging effects, which otherwise may result from the silicon nitride etch step. Forming a silicate glass layer between the silicide and the silicon nitride layer may thus enable selection of a silicon nitride etch process without having to consider the effect that such a process may have on silicide degradation or device charging.

Another advantage of this new process is that silicon nitride layer 120 may be formed using a hot wall CVD process instead of a PECVD process, because silicon glass layer 111 may protect the silicide from oxygen used in such a process. Such a relatively high temperature hot wall process may produce a higher quality furnace nitride, with improved uniformity, than may be produced by a relatively low temperature PECVD process. In addition, such a hot wall process should not generate potentially troublesome charging effects that a PECVD process may produce.

Features shown in the above referenced drawings are not intended to be drawn to scale, nor are they intended to be shown in precise positional relationship. For example, borderless contact 110 could be formed further to the right from the position shown in FIG. 4 and the relative thickness of layer 111 to layer 120 may vary from what is shown in the figures. Additional process steps that may be used to make the embodiments described above have been omitted when not useful to describe aspects of the present invention.

Although the foregoing description has specified an integrated circuit that includes certain features, and has specified certain materials and process steps for making such an integrated circuit, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for forming an integrated circuit comprising:
   forming a conductive region on a semiconductor substrate;
   forming a silicate glass layer on the conductive region;
   forming an etch stop layer on the silicate glass layer; and
   forming a borderless contact coupled to the conductive region by etching through the etch stop layer, then etching through the silicate glass layer to form a via, then filling the via with a conductive material.

2. The method of claim 1 wherein the silicate glass layer comprises a silicon dioxide layer; and the etch stop layer comprises silicon nitride, and further comprising forming a phosphosilicate glass (PSG) layer on the silicon nitride layer.

3. The method of claim 2 wherein the borderless contact is formed by etching a via through the PSG layer, the silicon nitride layer, and the silicon dioxide layer, then filling the via with a conductive material.

4. The method of claim 3 wherein the silicon nitride layer is formed using a hot wall chemical vapor deposition process.

5. The method of claim 4 wherein the via is etched through the PSG layer, the silicon nitride layer, and the silicon dioxide layer in three separate etching steps.

6. The method of claim 5 wherein the borderless contact is formed by successively depositing in the via relatively thin titanium and titanium nitride layers and a relatively thick tungsten plug.

7. A method for forming an integrated circuit comprising:
    forming a conductive region on a semiconductor substrate;
    forming an undoped silicon dioxide layer on the conductive region;
    forming a silicon nitride layer on the undoped silicon dioxide layer;
    forming a PSG layer on the silicon nitride layer; and
    forming a borderless contact coupled to the conductive region by etching through the silicon nitride layer, then etching through the undoped silicon dioxide layer to form a via, then filling the via with a conductive material.

8. The method of claim 7 wherein the undoped silicon dioxide layer formed on the conductive region is between about 200 and about 400 angstroms thick, and the silicon nitride layer is between about 200 and about 500 angstroms thick.

9. The method of claim 8 wherein the silicon nitride layer is formed using a hot wall chemical vapor deposition process and the silicon dioxide and PSG layers are both formed using a plasma enhanced chemical vapor deposition process.

10. The method of claim 9 further comprising etching a via through the PSG layer, the silicon nitride layer, and the silicon dioxide layer in three separate etch steps, then successively depositing in the via relatively thin titanium and titanium nitride layers and a relatively thick tungsten plug.

* * * * *

UNITED STATES PATENT AND TRADEMARK OFFICE
CERTIFICATE OF CORRECTION

PATENT NO. : 6,228,777 B1
DATED : May 8, 2001
INVENTOR(S) : Arafa et al.

It is certified that error appears in the above-identified patent and that said Letters Patent is hereby corrected as shown below:

Column 2,
Line 24, delete "suicides" and insert -- silicides --.
Line 32, delete "suicides" and insert -- silicides --.

Signed and Sealed this

Seventh Day of May, 2002

Attest:

JAMES E. ROGAN
*Attesting Officer*     *Director of the United States Patent and Trademark Office*